(12) United States Patent
Park et al.

(10) Patent No.: US 10,191,120 B2
(45) Date of Patent: Jan. 29, 2019

(54) APPARATUS FOR DETECTING DEFECT OF ELECTRIC POWER SYSTEM

(71) Applicant: LSIS CO., LTD., Gyeonggi-do (KR)

(72) Inventors: Hae-Yong Park, Gyeonggi-do (KR); Chae-Yoon Bae, Gyeonggi-do (KR); Jung-Wook Sim, Gyeonggi-do (KR); Gyeong-Ho Lee, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 4 days.

(21) Appl. No.: 15/383,113

(22) Filed: Dec. 19, 2016

(65) Prior Publication Data

US 2017/0248660 A1 Aug. 31, 2017

(30) Foreign Application Priority Data

Feb. 26, 2016 (KR) ........................ 10-2016-0023338

(51) Int. Cl.
*G01R 31/40* (2014.01)
*G01R 31/02* (2006.01)
*G01R 1/30* (2006.01)
*G01R 15/18* (2006.01)
*G01R 15/22* (2006.01)
*H02H 3/08* (2006.01)
*H02H 3/44* (2006.01)

(52) U.S. Cl.
CPC ............... *G01R 31/40* (2013.01); *G01R 1/30* (2013.01); *G01R 15/18* (2013.01); *G01R 31/024* (2013.01); *G01R 15/22* (2013.01); *H02H 3/08* (2013.01); *H02H 3/44* (2013.01)

(58) Field of Classification Search
CPC .................................................. G01R 31/1245
USPC ......................................... 324/500, 509, 512
See application file for complete search history.

(56) References Cited

U.S. PATENT DOCUMENTS

| 3,610,938 A | 10/1971 | Cook et al. |
| 5,107,235 A | 4/1992 | Torres-Isea |
| 5,805,397 A | 9/1998 | MacKenzie |

(Continued)

FOREIGN PATENT DOCUMENTS

| EP | 2975719 A1 | 1/2016 |
| GB | 1199982 A | 7/1970 |

(Continued)

OTHER PUBLICATIONS

Extended European Search Report dated Jun. 19, 2017 corresponding to application No. 16204107.3-1568.

(Continued)

*Primary Examiner* — Giovanni Astacio-Oquendo
(74) *Attorney, Agent, or Firm* — K&L Gates LLP

(57) ABSTRACT

An apparatus for detecting a defect of an electric power system according to one embodiment of the present disclosure includes a first state signal output unit for outputting a first state signal corresponding to a magnetic force generated at a periphery of a line, a second state signal output unit for outputting a second state signal based on a magnitude of a line current and an increase ratio thereof, and a determination unit for determining whether the electric power system is defective or not based on the first state signal and the second state signal.

6 Claims, 6 Drawing Sheets

[DEFECT STATE]

(56) References Cited

U.S. PATENT DOCUMENTS

| | | | |
|---|---|---|---|
| 6,593,751 B2* | 7/2003 | Takahashi | G01R 31/346 324/509 |
| 2002/0130664 A1* | 9/2002 | Birken | G01V 3/15 324/329 |
| 2007/0200563 A1* | 8/2007 | Daalmans | G01N 27/9006 324/237 |
| 2014/0091787 A1* | 4/2014 | Hyodo | G01V 3/105 324/236 |
| 2015/0055260 A1 | 2/2015 | Tekletsadik et al. | |
| 2015/0253370 A1* | 9/2015 | Fantoni | G01R 31/11 702/58 |
| 2016/0131692 A1* | 5/2016 | Jaffrey | G01R 31/1272 324/544 |

FOREIGN PATENT DOCUMENTS

| | | |
|---|---|---|
| GB | 1250810 A | 10/1971 |
| JP | H2253174 A | 10/1990 |
| JP | 3055825 A | 4/2000 |
| JP | 2001103654 A | 4/2001 |
| JP | 2011034771 A | 2/2011 |
| KR | 200166094 Y1 | 2/2000 |
| KR | 20020047777 A | 6/2002 |
| KR | 20070089091 A | 8/2007 |
| KR | 20090071093 A | 7/2009 |
| KR | 20120137972 A | 12/2012 |
| KR | 101577641 B1 | 12/2015 |
| WO | 03079388 A1 | 9/2003 |

OTHER PUBLICATIONS

Japanese Office Action dated May 23, 2017 corresponding to application No. 2016-243576.

* cited by examiner

- Prior Art -

[DEFECT STATE]

[NORMAL STATE]

APPARATUS FOR DETECTING DEFECT OF ELECTRIC POWER SYSTEM

CROSS REFERENCE TO RELATED APPLICATION

This application claims the benefit of Korean Patent Application No. 10-2016-0023338, filed on Feb. 26, 2016, entitled "APPARATUS FOR DETECTING DEFECT OF ELECTRIC POWER SYSTEM", which is hereby incorporated by reference in its entirety into this application.

BACKGROUND

1. Technical Field

The present disclosure relates to an apparatus for detecting a defect of an electric power system, which is connected to the electric power system.

2. Description of the Related Art

An apparatus for detecting a defect of an electric power system is an electric power device which is connected to the electric power system to detect a defect current when the defect current such as an overcurrent or a short circuit current is generated at the electric power system. The apparatus for detecting a defect of an electric power system trips a circuit breaker (that is, automatically breaks a circuit) or limits a current (breaks a circuit to limit a conducting current) when a defect current is detected.

FIG. 1 is a diagram illustrating a conventional apparatus for detecting a defect of an electric power system. Hereinafter, an operation process of the conventional apparatus 10 for detecting a defect of an electric power system will be described with reference to FIG. 1. The conventional apparatus 10 for detecting a defect of an electric power system may determine whether a defect of an electric power system occurs or not based on a magnitude of a line current and an increase ratio thereof.

Firstly, a detector 11 detects a magnitude of a line current, and an amplifier 12 amplifies the detected magnitude of the line current. Thereafter, a comparator 13 compares the amplified magnitude of the line current with a first set value Ref1 and may output a first output signal when the amplified magnitude of the line current is equal to or greater than the first set value Ref1.

Meanwhile, a differentiator 14 calculates an increase ratio of the line current, and an amplifier 15 amplifies the calculated increase ratio of the line current. Thereafter, a comparator 16 compares the amplified increase ratio of the line current with a second set value Ref2 and may output a second output signal when the amplified increase ratio of the line current is equal to or greater than the second set value Ref2. Afterward, a determination unit 17 may determine whether the electric power system is failed or not on the basis of the first output signal and the second output signal.

However, there is a problem in that the conventional apparatus 10 for detecting a defect of an electric power system could only determine whether the electric power system is failed or not and could not determine whether noise occurs or not.

That is, the conventional apparatus 10 for detecting a defect of an electric power system determines whether noise occurs or not after detecting whether the electric power system is failed or not, and then stops an operation when the noise occurs. Consequently, there is a problem in that the conventional apparatus 10 for detecting a defect of an electric power system could not detect whether the electric power system is failed during the operation stoppage due to an input of noise. Also, there is a problem in that the conventional apparatus 10 for detecting a defect of an electric power system is sensitive to noise to perform an incorrect operation owing to the noise.

SUMMARY

An object of the present disclosure is to provide an apparatus for detecting a defect of an electric power system, which is capable of reducing an operation delay due to noise by outputting a state signal using a magnetic force generated at a periphery of a line.

Another object of the present disclosure is to provide an apparatus for detecting a defect of an electric power system, which is capable of reducing an incorrect operation due to noise by outputting a state signal using a magnetic force generated at a periphery of a line.

Still another object of the present disclosure is to provide an apparatus for detecting a defect of an electric power system, which is capable of increasing reliability of a defect detection by determining whether the electric power system is defective or not using a first state signal based on a magnetic force and a second state signal based on a magnitude of a line current and an increase ratio thereof.

Yet another object of the present disclosure is to provide an apparatus for detecting a defect of an electric power system, which is capable of reducing a defect detection time by comparing a set value with a measured value to determine a defect.

To attain the objects described above, an apparatus for detecting a defect of an electric power system based on a magnitude of a line current flowing at a line according to one embodiment of the present disclosure includes a first state signal output unit configured to output a first state signal by contacting one end of a moving unit to one end of a fixing unit using a magnetic force generated at a periphery of the line, a second state signal output unit configured to output a second state signal based on a magnitude of the line current and an increase ratio thereof, and a determination unit configured to determine whether the electric power system is defective or not based on the first state signal and the second state signal.

In accordance with the present disclosure as described above, a state signal is output using a magnetic force generated at a periphery of a line so that there is an effect in that whether an electric power system is defective or not may be consistently detected even when noise occurs.

Also, in accordance with the present disclosure, a state signal is output using a magnetic force generated at a periphery of a line so that there is an effect in that an incorrect operation due to noise may be reduced.

Further, in accordance with the present disclosure, whether an electric power system is defective or not is determined using a first state signal based on a magnetic force and a second state signal based on a magnitude of a line current and an increase ratio thereof so that there is an effect in that reliability of a defect detection may be increased.

Moreover, in accordance with the present disclosure, a defect is determined by comparing a set value with a measured value so that there is an effect in that a defect detection time may be reduced.

DETAILED DESCRIPTION

Figure 1:
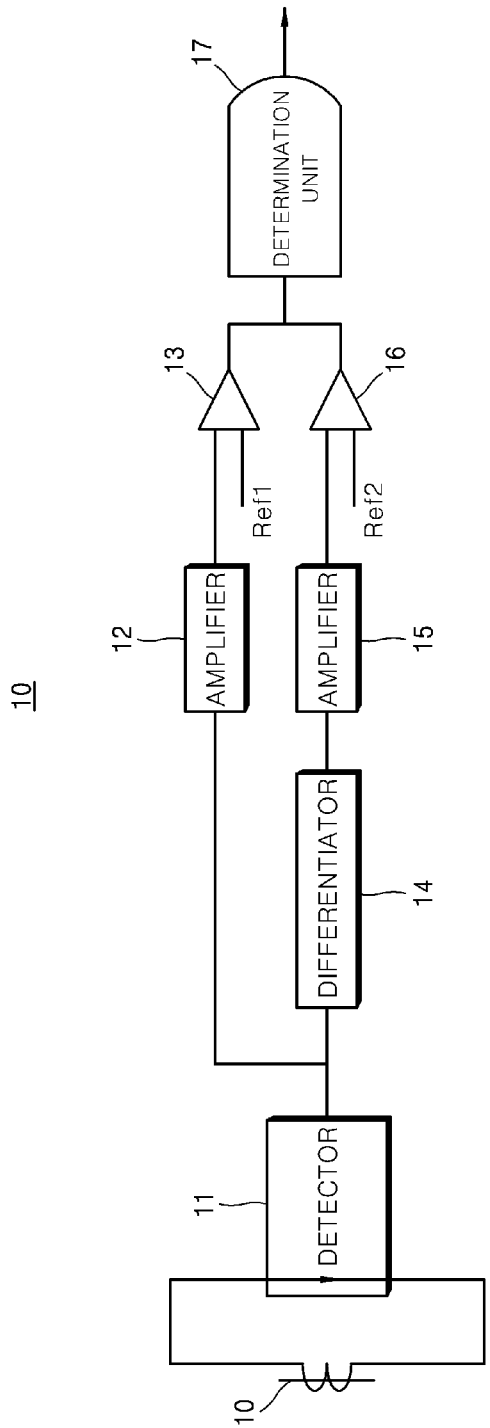
FIG. 1 is a diagram illustrating a conventional apparatus for detecting a defect of an electric power system.

The above and other objects, features and advantages of the present disclosure will be described later in detail with reference to the accompanying drawings, and thus the technical spirit of the present disclosure can be easily implemented by those skilled in the art. In the following description of the present disclosure, if a detailed description of known configurations and functions is determined to obscure the interpretation of embodiments of the present disclosure, the detailed description thereof will be omitted. Hereinafter, preferred embodiments according to the present disclosure will be described in detail with reference to the accompanying drawings. In the drawings, the same reference numerals refer to the same or similar elements throughout.

Figure 2:
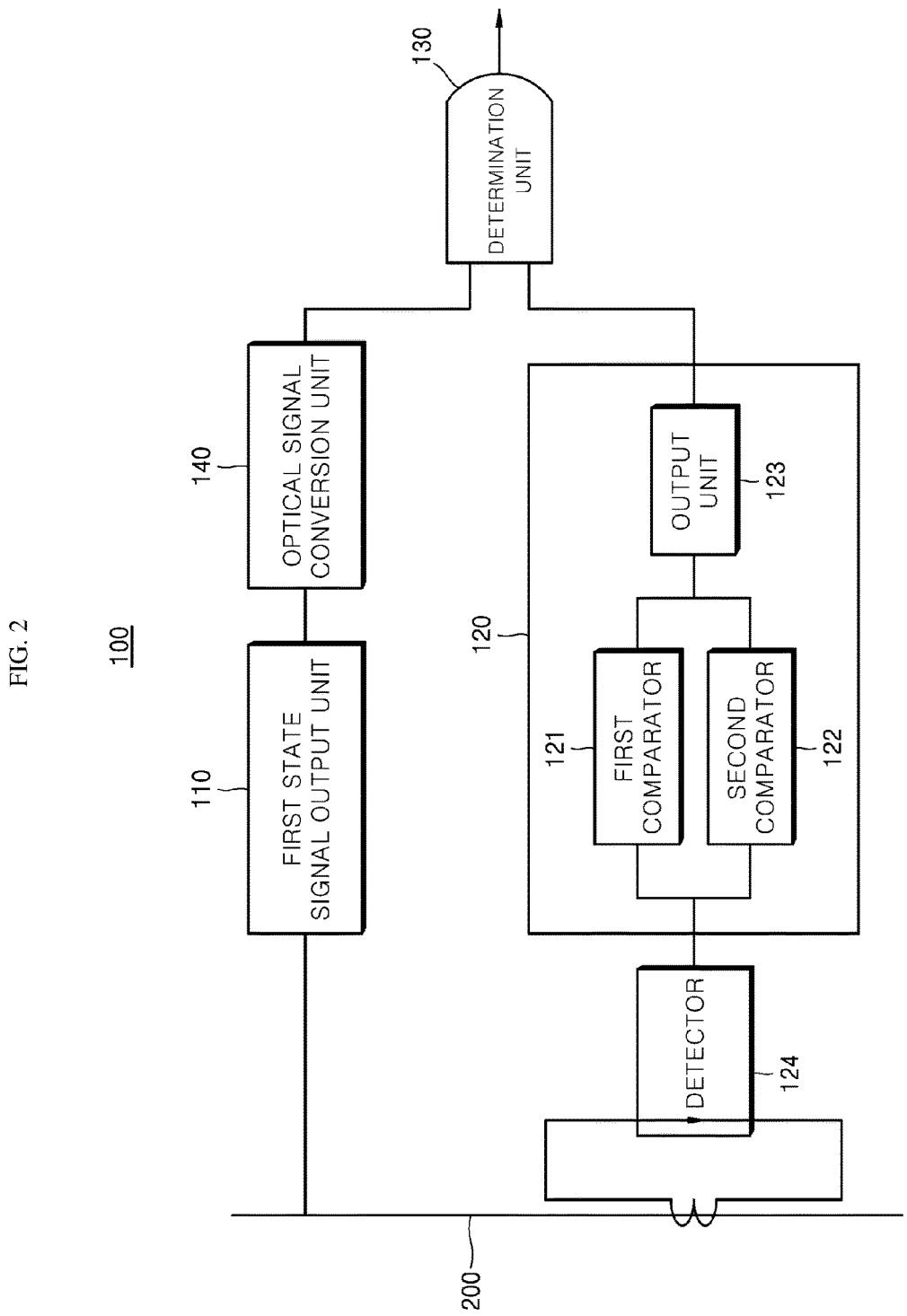
FIG. 2 is a diagram illustrating an apparatus for detecting a defect of an electric power system according to one embodiment of the present disclosure.

FIG. 2 is a diagram illustrating an apparatus 100 for detecting a defect of an electric power system according to one embodiment of the present disclosure.

Referring to FIG. 2, the apparatus 100 for detecting a defect of an electric power system according to one embodiment of the present disclosure may be configured to include a first state signal output unit 110, a second state signal output unit 120, a determination unit 130, and an optical signal conversion unit 140. The apparatus 100 for detecting a defect of an electric power system shown in FIG. 2 is according to one embodiment, components thereof are not limited to the embodiment shown in FIG. 2, and some component may be added, changed, or omitted as necessary.

Figure 3:
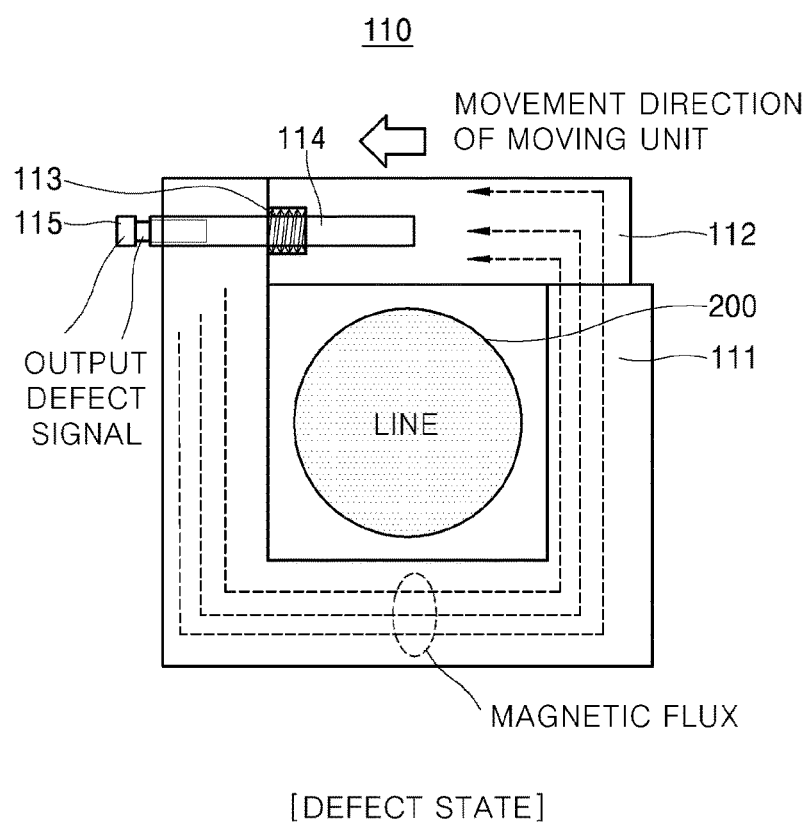
FIG. 3 is a diagram illustrating a first state signal output unit in a defect state according to one embodiment of the present disclosure.
Figure 4:
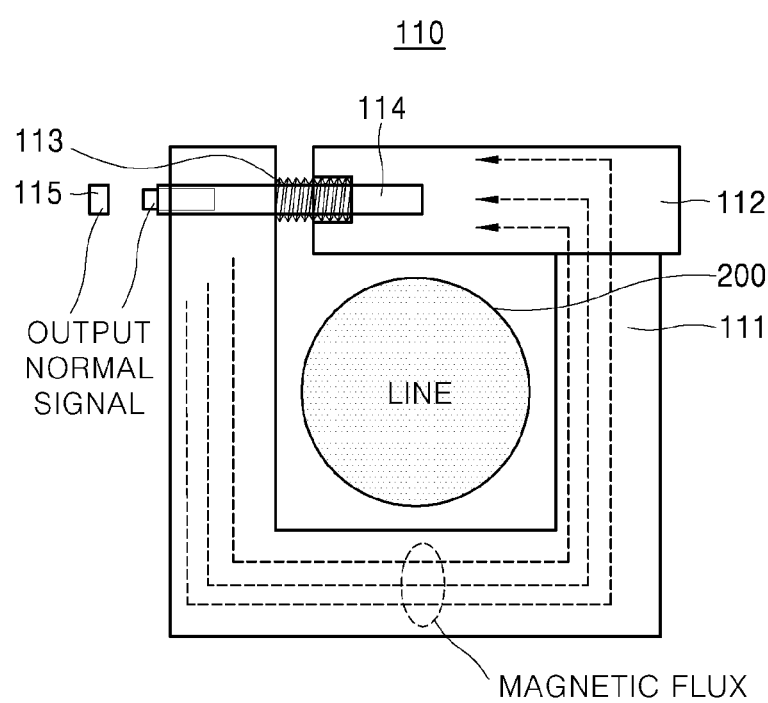
FIG. 4 is a diagram illustrating the first state signal output unit in a normal state according to one embodiment of the present disclosure.

FIG. 3 is a diagram illustrating the first state signal output unit 110 in a defect state according to one embodiment of the present disclosure, and FIG. 4 is a diagram illustrating the first state signal output unit 110 in a normal state according to one embodiment of the present disclosure.

Figure 5:
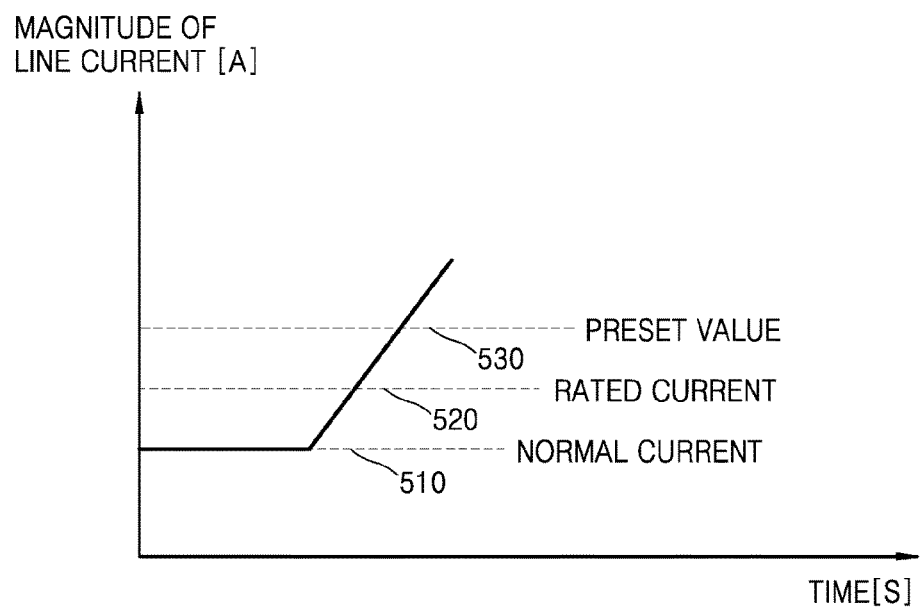
FIG. 5 is a graph illustrating a magnitude of a line current according to one embodiment of the present disclosure.
Figure 6:
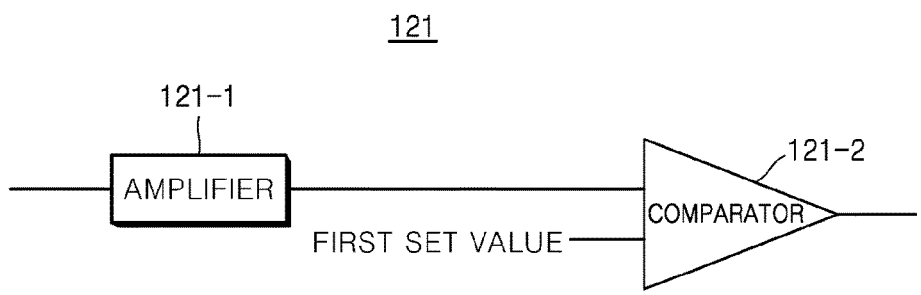
FIG. 6 is a diagram illustrating a first comparison unit according to one embodiment of the present disclosure.
Figure 7:
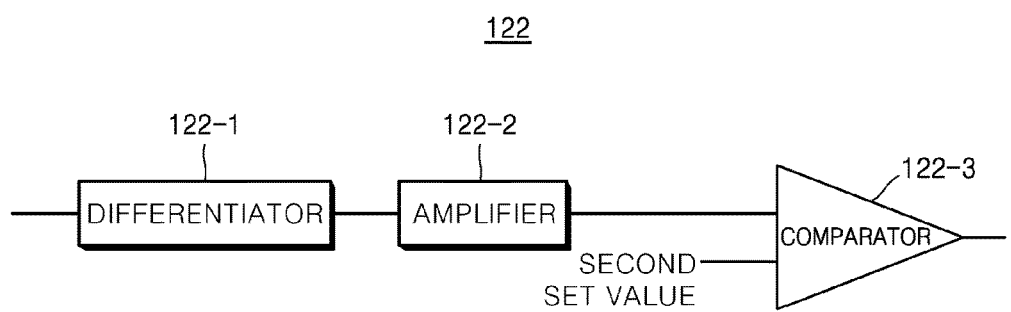
FIG. 7 is a diagram illustrating a second comparison unit according to one embodiment of the present disclosure.

FIG. 5 is a graph illustrating a magnitude of a line current according to one embodiment of the present disclosure. FIG. 6 is a diagram illustrating a first comparison unit 121 according to one embodiment of the present disclosure, and FIG. 7 is a diagram illustrating a second comparison unit 122 according to one embodiment of the present disclosure.

Hereinafter, the apparatus 100 for detecting a defect of an electric power system according to one embodiment of the present disclosure will be described with reference to FIGS. 3 to 7.

The first state signal output unit 110 may output a first state signal by contacting one end of a moving unit 112 to one end of a fixing unit 111 using a magnetic force generated surrounding a line 200. The moving unit 112 and the fixing unit 111 are objects provided at a periphery of the line 200, and the moving unit 112 may connect both ends of the fixing unit 111 to each other through left and right movement at the both ends of the fixing unit 111. The fixing unit 111 is the object fixed to the periphery of the line 200, and a configuration of the moving unit 112 may be the same as that of the fixing unit 111.

In other words, the first state signal output unit 110 includes the fixing unit 111 and the moving unit 112 which are disposed at the periphery of the line 200. The moving unit 112 is moved to one end side of the fixing unit 111 by means of a magnetic force generated at the periphery of the line 200. Illustratively, when the moving unit 112 comes into contact with the other end of the fixing unit 111, it may be moved toward the one end of the fixing unit 111 by means of a magnetic force generated at the periphery of the line 200. At this point, the moving unit 112 comes into contact with the one end of the fixing unit 111 when the magnetic force generated at the periphery of the line 200 is sufficiently large, whereas the moving unit 112 does not come into contact with the one end of the fixing unit 111 when the magnetic force generated at the periphery of the line 200 is small.

Therefore, the first state signal output unit 110 outputs a first state signal corresponding to a contact or a non-contact between the moving unit 112 and the fixing unit 111 due to the magnetic force at the periphery of the line 200. That is, the first state signal of the first state signal output unit 110 corresponds to the magnetic force at the periphery of the line 200.

Also, a shape of each of the moving unit 112 and the fixing unit 111 is not limited to a quadrangular shape as shown in FIGS. 3 and 4, and it may be a different shaped figure. The first state signal is a signal representing that a line current is in a defect state or in a normal state, and may include a defect signal and a normal signal.

Magnetic flux shown in FIGS. 3 and 4 is a line illustrating a magnitude of a magnetic force. The magnetic flux is increased when a magnitude of a magnetic force is large and is decreased when the magnitude of the magnetic force is small. Meanwhile, the magnetic force is increased when a magnitude of a line current flowing at the line 200 is large, and is decreased when the magnitude of the line current is small. A direction of the magnetic force is formed in a direction of a right-hand screw on a plane perpendicular to a direction in which the line current flows according to Ampere's right-handed screw rule. Also, the magnetic force moves the moving unit 112 described above to come into contact with the fixing unit 111.

As one embodiment, the first state signal output unit 110 may be configured to further include a spring 113, a first insulator 114, and a second insulator 115. The first state signal output unit 110 shown in FIGS. 3 and 4 is according to one embodiment, components thereof are not limited to the embodiment shown in FIGS. 3 and 4, and some components may be added, changed, or omitted as necessary.

Referring to FIGS. 3 and 4, the spring 113 may be connected to one end of the moving unit 112 and one end of the fixing unit 111. When a magnetic force is increased in proportion to a magnitude of a line current, one end of the moving unit 112 comes into contact with one end of the fixing unit 111. Thereafter, when the magnetic force is reduced, the spring 113 separates the moving unit 112 from the one end of the fixing unit 111.

The first insulator 114 may be located inside the spring 113, and the second insulator 115 may come into contact with the first insulator 114 when the one end of the moving unit 112 comes into contact with the one end of the fixing unit 111.

Referring to FIG. 3, there is shown a defect state and thus a magnitude of a line current is large so that strength of a magnetic force is increased. When the strength of the magnetic force is greater than an elastic force of the spring 113, the one end of the moving unit 112 comes into contact with the one end of the fixing unit 111. When the one end of the moving unit 112 comes into contact with the one end of the fixing unit 111, the first insulator 114 and the second insulator 115 also contact to each other. When the first insulator 114 and the second insulator 115 contact to each other, the first state signal output unit 110 may output a defect signal.

Meanwhile, there is shown a normal state and thus a magnitude of a magnetic force is less than the elastic force of the spring 113 and the one end of the moving unit 112 is spaced apart from the one end of the fixing unit 111 without coming into contact therewith. When the one end of the moving unit 112 is spaced apart from the one end of the fixing unit 111, the first insulator 114 and the second insulator 115 also do not contact to each other. When the first insulator 114 and the second insulator 115 do not contact to each other, the first state signal output unit 110 may output a normal signal.

As one embodiment, the first state signal output unit 110 may output the defect signal when a magnitude of the line current is equal to or greater than a preset value, and may output the normal signal when the magnitude of the line current is less than the preset value. The preset value may be set by a user or may be automatically set at the first state signal output unit 110.

Meanwhile, referring to FIG. 5, the preset value is greater than a normal current and a rated current, and the first state signal output unit 110 may uniformly determine a defect based on the preset value to reduce a defect detection time. Meanwhile, the first state signal output unit 110 may determine to a normal current when the magnitude of the line current is constant, whereas it may determine to a rated current when the magnitude of the line current is not constant but magnitude variation thereof is small.

The second state signal output unit 120 may output a second state signal based on a magnitude of the line current and an increase ratio thereof. Firstly, the second state signal output unit 120 detects a magnitude of the line current and then amplifies the detected magnitude of the line current. Thereafter, the amplified magnitude of the line current and a first set value are compared with each other and then a first output signal may be output when the amplified magnitude of the line current is equal to or greater than the first set value. For example, when the magnitude of the line current is equal to or greater than the first set value, the first output signal may be "1," and, when the magnitude of the line current is less than the first set value, the first output signal may be "0."

Also, the second state signal output unit 120 detects an increase ratio of the line current and then amplifies the detected increase ratio of the line current. Thereafter, the amplified increase ratio of the line current and a second set value are compared with each other, and then a second output signal may be output when the amplified increase ratio of the line current is equal to or greater than the second set value. As this point, the increase ratio of the line current may be the gradient of a graph in FIG. 5, and the second state signal output unit 120 may detect the increase ratio of the line current by differentiating the graph shown in FIG. 5. Meanwhile, when the increase rate of the line current is equal to or greater than the second set value, the second output signal may be "1," and, when the magnitude of the line current is less than the second set value, the second output signal may be "0."

When the first output signal and the second output signal are output, the second state signal output unit 120 may output a second state signal based on these output signals. For example, when the first output signal is "1" and the second output signal is "1," the magnitude of the line current and the increase ratio thereof are equal to or greater than a set value so that "1" may be output as a second state signal representing a defect state. Meanwhile, when the first output signal is "1" and the second output signal is "0," only the magnitude of the line current is equal to or greater than the first set value and the increase ratio of the line current is less than the second set value so that "0" may be output as a second state signal representing a normal state.

As one embodiment, the second state signal output unit 120 may be configured to include the first comparison unit 121, the second comparison unit 122, an output unit 123, and a detector 124. The second state signal output unit 120 shown in FIG. 2 is according to one embodiment, components thereof are not limited to the embodiment shown in FIG. 2, and some components may be added, changed, or omitted as necessary.

The first comparison unit 121 may amplify the magnitude of the line current, compare the amplified magnitude of the line current with the first set value, and output a first output signal when the amplified magnitude of the line current is equal to or greater than the first set value. Referring to FIG. 6, an amplifier 121-1 may amplify a magnitude of a current, and a comparator 121-2 may compare the first set value with the amplified magnitude of the current.

Also, the second comparison unit 122 may amplify an increase ratio of the line current, compare the amplified increase ratio of the line current with the second set value, and output a second output signal when the amplified increase ratio of the line current is equal to or greater than the second set value. Referring to FIG. 7, a differentiator 122-1 may calculate the increase ratio of the line current, and an amplifier 122-2 may amplify the increase ratio of the line current. Thereafter, a comparator 122-3 may compare the amplified increase ratio of the line current with the second set value to output a second output signal.

The output unit 123 may output a second state signal based on the first output signal and the second output signal. The detector 124 is a device that is connected to the line 200 to detect a line current signal, and may transmit the detected line current signal to the first comparison unit 121 and the second comparison unit 122.

The optical signal conversion unit 140 may convert a first state signal into an optical signal when the first state signal is output from the first state signal output unit 110. Because the first state signal is an electrical signal, the optical signal conversion unit 140 serves to convert the first state signal into an optical signal to transmit the optical signal to the determination unit 130. More particularly, the optical signal conversion unit 140 may convert an electrical signal into an optical signal and transmit the optical signal through an optical fiber, and then convert again the transmitted optical signal into an electrical signal to transmit the electrical signal to the determination unit 130. The optical fiber includes a material of a large refractive index at an inside of the optical fiber and a material of a small refractive index at an outside of the optical fiber, thereby transmitting an optical signal using a total reflection of the optical signal. Meanwhile, the optical signal conversion unit 140 includes a photo diode, an optical converter, and the like, and a kind of the optical signal conversion unit 140 is not limited to the described above.

The determination unit 130 may determine a defect of an electric power system based on the first state signal and the second state signal. Also, the determination unit 130 may determine the defect of the electric power system based on the first state signal and the second state signal which are converted into electrical signals. For example, when the first state signal is "1" and the second state signal is "1," the determination unit 130 may determine that the electric power system is in a defect state. Meanwhile, when the first state signal is "1" and the second state signal is "0," or the first state signal is "0" and the second state signal is "1," the determination unit 130 may determine that the electric power system is in a normal state. Also, when the first state signal is "0" and the second state signal is "0," the determination unit 130 may determine that the electric power system is in the normal state.

In accordance with the present disclosure as described above, a state signal is output using a magnetic force generated at a periphery of a line so that there is an effect in that an operation delay due to noise may be reduced. Also, in accordance with the present disclosure, the state signal is output using the magnetic force generated at the periphery of the line so that there is an effect in that an incorrect operation due to noise may be reduced. In addition, the present disclosure determines a defect of an electric power system using a first state signal based on a magnetic force and a second state signal based on a magnitude of a line current and an increase ratio thereof so that there is an effect in that reliability of a defect detection may be increased. Moreover, the present disclosure determines a defect by comparing a set value with a measured value so that there is an effect in that a defect detection time may be reduced.

Although the present disclosure has been described with reference to the embodiments, it should be understood that numerous other substitutions, modifications and alterations can be devised by those skilled in the art without departing the technical spirit of this disclosure, and thus it should be construed that the present disclosure is not limited by the embodiments described above and the accompanying drawings.

What is claimed is:

1. An apparatus for detecting a defect of an electric power system, the apparatus comprising:
    a first state signal output mechanism configured to output a first state signal corresponding to a magnetic force generated at a periphery of a line;
    a second state signal output mechanism configured to output a second state signal based on a magnitude of a line current and an increase ratio thereof;
    a defect determination mechanism configured to determine whether the electric power system is defective based on the first state signal and the second state signal; and
    an optical signal conversion mechanism disposed between the first state signal output mechanism and the defect determination mechanism and configured to convert the first state signal into an optical signal when the first state signal is output from the first state signal output mechanism.

2. The apparatus of claim 1, wherein the first state signal output mechanism includes a fixing unit and a moving unit which are disposed at the periphery of the line,
    wherein the moving unit is moved toward one end of the fixing unit by means of the magnetic force generated at the periphery of the line.

3. The apparatus of claim 2, wherein the first state signal output mechanism outputs the first state signal as a defect signal when the moving unit comes into contact with the one end of the fixing unit by means of the magnetic force generated at the periphery of the line, and as a normal signal when the moving unit does not come into contact with the fixing unit.

4. The apparatus of claim 3, wherein the first state signal output mechanism further includes:
    a spring connected between the one end of the fixing unit and one end of the moving unit facing the one end of the fixing unit;
    a first insulator located inside the spring; and
    a second insulator configured to come into contact with the first insulator when the one end of the moving unit comes into contact with the one end of the fixing unit.

5. The apparatus of claim 4, wherein the first state signal output mechanism outputs the first state signal as the defect signal when the one end of the moving unit comes into contact with the one end of the fixing unit by means of the magnetic force generated at the periphery of the line so that the first and second insulators contact to each other, and as the normal signal when the first and second insulators do not contact to each other.

6. The apparatus of claim 1, wherein the second state signal output mechanism includes:
    a first comparator configured to amplify the magnitude of the line current, compare the amplified magnitude of the line current with a first set value, and output a first output signal when the amplified magnitude of the line current is equal to or greater than a first set value;
    a second comparator configured to amplify the increase ratio of the line current, compare the amplified increase ratio of the line current with a second set value, and output a second output signal when the amplified increase ratio of the line current is equal to or greater than the second set value; and
    an output unit configured to output the second state signal based on the first output signal and the second output signal.

* * * * *